United States Patent

Foster et al.

[11] Patent Number: 5,920,277
[45] Date of Patent: Jul. 6, 1999

[54] SECONDARY SURVEILLANCE RADAR

[75] Inventors: Jeremy Le Neve Foster, Buckinghamshire; Geoffrey Morris, Middlesex, both of United Kingdom

[73] Assignee: Fernau Avionics Ltd, Bedfordshire, United Kingdom

[21] Appl. No.: 08/952,195

[22] PCT Filed: May 3, 1996

[86] PCT No.: PCT/GB96/01100

§ 371 Date: Feb. 9, 1998

§ 102(e) Date: Feb. 9, 1998

[87] PCT Pub. No.: WO96/36110

PCT Pub. Date: Nov. 14, 1996

[30] Foreign Application Priority Data

May 11, 1995 [GB] United Kingdom ................ 95303181

[51] Int. Cl.[6] .................................................. G01S 13/87
[52] U.S. Cl. .............................. 342/32; 342/37; 342/43; 342/46

[58] Field of Search ................................. 342/30, 32, 36, 342/37, 42, 43, 46

[56] References Cited

U.S. PATENT DOCUMENTS

| | | | |
|---|---|---|---|
| 5,077,673 | 12/1991 | Brodegard et al. | 364/461 |
| 5,157,615 | 10/1992 | Brodegard et al. | 364/461 |
| 5,400,031 | 3/1995 | Fitts | 342/36 |
| 5,619,206 | 4/1997 | Cole, Jr. et al. | 342/37 |
| 5,636,123 | 6/1997 | Rich et al. | 364/461 |

*Primary Examiner*—John B. Sotomayor
*Attorney, Agent, or Firm*—Dilworth & Barrese

[57] ABSTRACT

A secondary surveillance radar e.g. a Mode-S radar, has a controllable power source in which first and second in-phase r.f. signals are derived from a source (6) by a power splitter (11), and a phase shifter (32) adjusts selectively the relative phase of the signals, so that after amplification by main amplifiers (21, 22) and combination by power comber (23), the resultant power level can be controlled by the phase shift produced by the phase shifter (32).

22 Claims, 2 Drawing Sheets $V_R^2 = 2V^2(1+\cos\theta)$

SECONDARY SURVEILLANCE RADAR

FIELD OF THE INVENTION

This invention relates to a secondary surveillance radar and has particular but not exclusive application to a Mode-S radar for determining the position and identity of aircraft.

BACKGROUND

In a primary radar system, radar signals transmitted from an antenna are reflected by remote targets such as aircraft to produce returns. A receiver connected to the antenna processes the returns to determine the range and azimuth of the target. In a secondary radar, the identity of targets such as aircraft is determined by the use of transponders on each aircraft, which are interrogated by the transmitted radar signals. For example, secondary surveillance radar (SSR) is conventionally used to provide a picture of the position and identity of all aircraft in the immediate vicinity of an airfield, typically within a radius of 100 nautical miles. A ground radar station, termed the interrogator, transmits an interrogation signal at a radio frequency of 1030 MHz, which interrogates transponders that transmit a reply to the interrogator at a radio frequency of 1090 MHz.

The interrogator transmits r.f. energy by means of an antenna with a rotating directive pattern, which is usually constituted by a mechanical rotating antenna, but which may comprise a stationary, electronically steered phased array antenna, which has broad elevation and narrow azimuth. From a knowledge of the pointing direction of the interrogator antenna directive pattern, at the time it receives a reply from an aircraft, the azimuth bearing of the aircraft is obtained. In addition, the range of the aircraft is computed based on the duration from the interrogator transmission to the reception of the resultant reply. Hence, the range and bearing of the aircraft are obtained. For a fuller review of SSR techniques, reference is directed to "Radar Systems" Paul A. Lynn, Macmillan 1987, Chapter 6, pp 109–119.

The reply provided by conventional SSR transponder on an aircraft contains a limited amount of data, normally the aircraft altitude and its local identity. Recently, it has been proposed to introduce a more extensive bi-directional high capacity digital data link between the interrogated aircraft and the interrogator, known as Mode-S, where S denotes "selective".

The internationally agreed standard technical characteristics of Secondary Surveillance Radar are defined in the International Civil Aviation Organisation (ICAO) document "Aeronautical Telecommunications, Annex 10", Section 3.8. Section 3.8.1 covers conventional SSR and Section 3.8.1 Mode-S SSR.

Mode-S SSR, according to the aforementioned standard includes two main features. The first feature allows each aircraft transponder to be given a 25 bit address which is unique world-wide. Interrogation can therefore be directed at a specific aircraft and hence be selective, and the aircraft reply also contains its unique address. The feature allows enhanced signal processing of the reply signal by the interrogator.

The second feature allows the automatic transmission of both ground to air and air to ground, of a large quantity of data usually communicated between Air Traffic Control and the pilot of the aircraft by VHF voice communication. Thus, the automatic transmission between the ground and the aircraft in a Mode-S SSR may include transmission from the ground of flight control information and local weather conditions, and transmission from the air of data concerning fuel reserves, engine performance and weather.

Additionally, the interrogator for an SSR, and in particular a Mode-S SSR, should have the capability for its transmitted power to be varied during the rotation cycle of the antenna directive pattern. The range of interrogation is a function of the power of the transmitted radar signals and so by varying the power, the system can be selective in terms of range. The power variation required is typically over a range of 12 dB down from the maximum transmitted power in increments of 2 dB. The setting accuracy at each power level is typically ±1 dB and the time to switch between any power level is typically in the range 10 to 50 microseconds.

Hitherto, it has been difficult to achieve an efficient, rapid switching of power for a SSR and the present invention provides a solution to this problem.

SUMMARY OF THE INVENTION

In accordance with the present invention there is provided a secondary surveillance radar including: transmitter means for transmitting radar signals for interrogating transponders on remote targets; receiver means for receiving returns from the interrogated transponders on the targets; and a controllable power source for producing r.f. signals for the transmitter means, comprising means for producing first and second r.f. signals having a predetermined phase relationship; phase setting means for setting the phase relationship between the first and second signals selectively; first and second power amplifier means for amplifying the first and second signals respectively; and power combining means for combining the first and second signals amplified by the power amplifier means whereby to provide an amplified r.f. output signal of a power dependent upon the phase relationship set by the phase setting means.

By means of the invention, it is possible to vary the transmitted power rapidly and accurately by altering the phase relationship of the first and second signals. This can be achieved by means of an electronically controlled phase shifter. As a result, in accordance with the invention, the transmitted power can be controlled sufficiently rapidly to meet the aforementioned requirements for a Mode-S SSR.

The invention also extends to a method of operating a secondary surveillance radar including: transmitting radar signals so as to interrogate transponders on remote targets; receiving returns from the interrogated transponders on the targets; and controlling the power of the signals produced by the transmitter means, comprising producing first and second r.f. signals; selectively setting the phase relationship between the first and second signals, amplifying the first and second signals respectively; combining the first and second signals amplified by the power amplifier means whereby to provide an amplified r.f. output signal of a power dependent upon the set phase relationship; and feeding the output signal to the transmitting means.

BRIEF DESCRIPTION OF THE DRAWINGS

In order that the invention may be more fully understood, an embodiment thereof will now be described by way of example with reference to the accompanying drawings in which.

DETAILED DESCRIPTION

Figure 1:
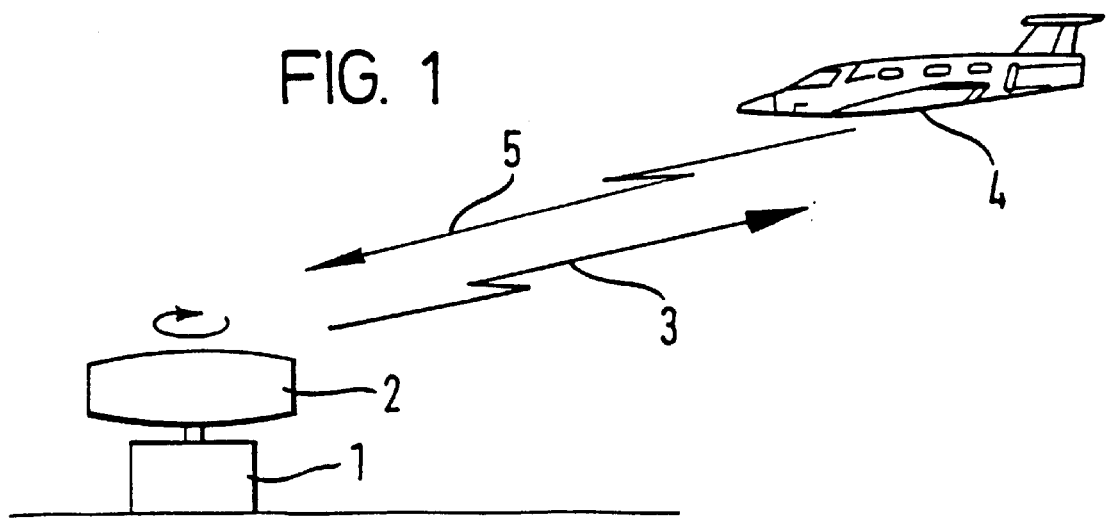
FIG. 1 is a schematic of an aircraft being interrogated by a Mode-S SSR in accordance with the invention.

Referring to FIG. 1, a ground based Mode-S SSR interrogator 1 is provided with a rotary antenna 2 which transmits radar signals 3 for interrogating transponders on aircraft such as aircraft 4. The antenna 2 is also used to receive returns 5 from the interrogated transponders, which are passed to a receiver in the interrogator 1. The interrogator is typically connected by a land line to a control station (not shown).

In use, the antenna 2 has a directive pattern that rotates, and in the embodiment shown in FIG. 1, the antenna is a mechanical rotary array. However, it will be appreciated that the static array which is electronically steerable could also be used. The system shown in FIG. 1 uses a monopulse transmission technique. Two beams are used comprising a main beam which produces what is generally known as a sum pattern, together with a further beam which produces what is known as the difference pattern. The sum pattern comprises a main lobe arranged on the boresight of the antenna whereas the difference pattern comprises side lobes disposed symmetrically on opposite sides of the boresight, which exhibits 180 degrees phase reversal at its null. The pattern allows an accurate estimation of the off-boresight azimuth of the transponder on the aircraft to be made by comparing the amplitudes and phases of signals obtained from the two patterns. Reference is directed to "Radar Systems" supra, for a more detailed explanation.

Figure 2:
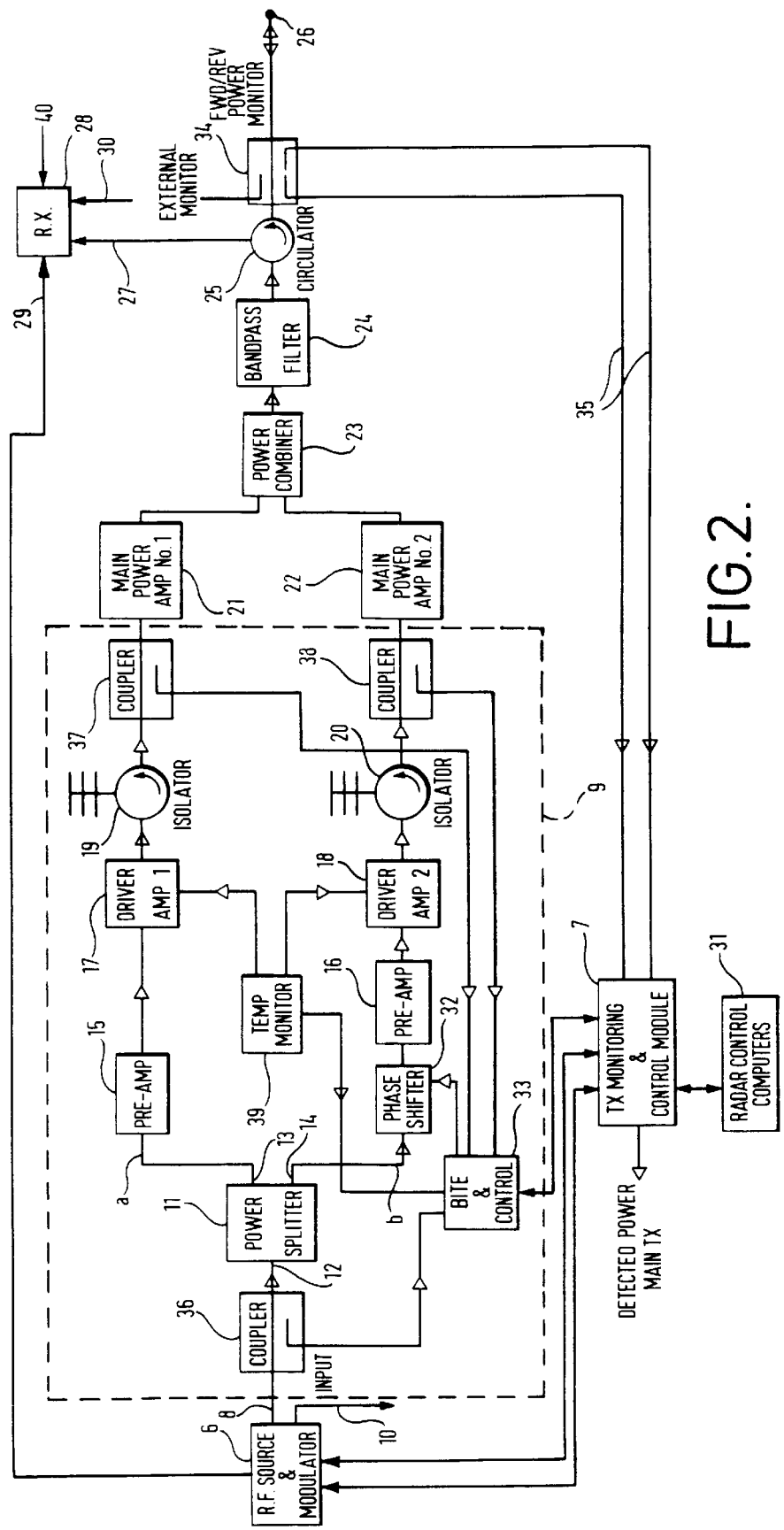
FIG. 2 is a schematic block diagram of the circuits of a Mode-S SSR in accordance with the invention.

In FIG. 2, circuits are shown for providing r.f. power to the antenna for the sum antenna beam. It will be appreciated that a corresponding circuit for an omnidirectional antenna beam will also be provided as in a conventional SSR, but it is not shown fully in FIG. 2 for purposes of clarity.

Referring to FIG. 2 in more detail, the controllable power source includes a r.f. source and modulator circuit 6 which generates a continuous wave interrogation signal at a radio frequency of 1030 MHz, which is pulse modulated under the control of a monitoring and control module 7. The pulse modulation encodes the interrogation signal with data to be transmitted to the aircraft 4 in accordance with the Mode-S SSR protocol. The pulse modulated output is provided on line 8 to a main driver amplifier circuit 9 shown within dotted outline. The main driver amplifier 9 controls the power fed to the main beam. The modulator also provides on line 10 an output, which is modulated with a different data stream, for use in providing the omnidirectional pattern and the power is controlled by another drive amplifier, similar to amplifier 9 (not shown). Since the circuits for the omnidirectional pattern are similar to those for the main beam pattern they will not be described further.

The main drive amplifier 9 includes a power splitter 11, which has an input 12 to receive signals from line 8, and first and second outputs 13, 14 that provide signals of equal amplitude and phase $V_a$ and $V_b$ on first and second channels a, b. The signals $V_a$ and $V_b$ are fed through respective pre-amplifiers 15, 16 and drive amplifiers 17, 18 and then through isolators 19, 20 to respective first and second main power amplifiers 21, 22.

The outputs of the first and second main power amplifiers 21, 22 are fed to a power combiner 23, the output of which is fed through a bandpass filter 24 and a circulator 25 to a port 26 for the main antenna beam. Thus, in use, the pulse modulated signals on line 8 are amplified in the respective channels a, b, initially by amplifiers 15 and 17, and 16 and 18, and then by means of power amplifiers 21 and 22, the resulting amplifier signals being combined in power combiner 23 and fed to port 26 to act as interrogation signals for the aircraft transponders. Returns from the transponders are received from the antenna and fed to port 26. The circulator 25 directs the returns on line 27 to a receiver circuit 28 which demodulates the returns using a local oscillator (not shown) which is locked in frequency to the r.f. source 6 over line 29. Also, the receiver 28 receives corresponding antenna returns from the difference pattern on line 30 and the omnidirectional pattern on line 40, and the signals are processed in a manner known per se in order to obtain aircraft identification and other operating data transmitted from the aircraft transponder. Also, the aircraft range and azimuth are computed in a manner known per se depending on the time delay between an initial transmitted interrogation pulse and the corresponding return received from the transponder, together with data concerning the angle of rotation of the antenna directive patterns. Such signal processing is known per se and will not be described further herein. The resulting data from the receiver 28 is fed (by means not shown) into radar control computers 31 which enable the aircraft to be tracked. Also, the computers determine the data that is transmitted to the aircraft by controlling the pulse modulation of source 6 through the control and monitoring circuit 7.

The amplifiers shown in FIG. 2 typically provide a maximum peak pulse power at port 26 of 1950 watts, corresponding to 62.9 dBm. The Mode-S SSR specification requires that the power at port 26 to be reduced from maximum, in 2 dB steps down to the value of 12 dB below maximum i.e. down to 50.9 dBm.

In accordance with the invention, this is achieved by means of a phase shifter 32 which varies the phase of signal $V_b$ relative to the phase of signal $V_a$. This is shown schematically in FIG. 3.

Figure 3:
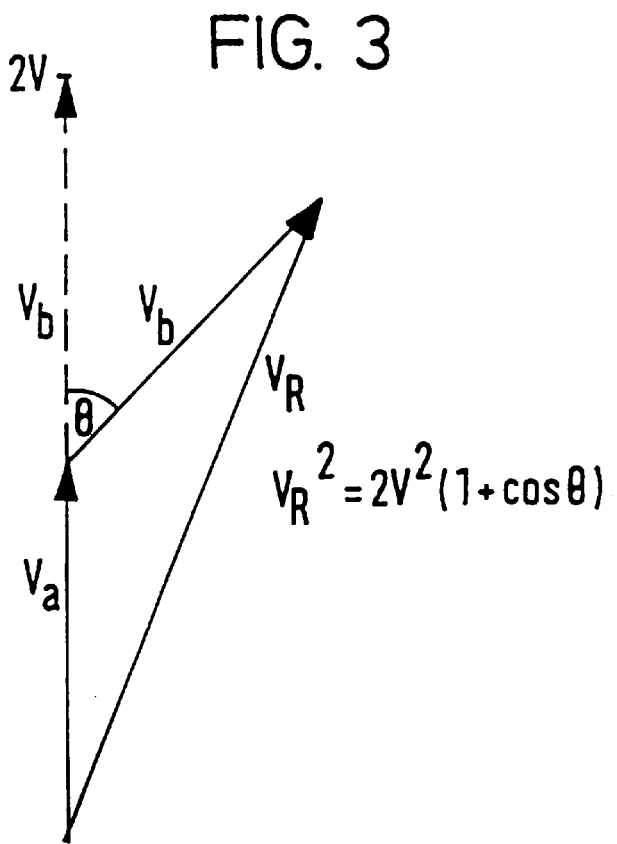
FIG. 3 is a vector diagram illustrating the phase vectors V for the first and second channels shown in FIG. 2.

When the phase vectors $V_a$ and $V_b$ are in phase, i.e. no phase shift is produced by the phase shifter 32, the phase vectors are aligned as shown in dotted outline so that the resulting phase vector produced by the combination of the signals in power combiner 23, is 2V. Conversely, when the phase vectors are in antiphase, the resultant power drops to zero. By introducing a phase shift with the phase shifter 32, the phase angle θ between the phase vectors $V_a$ and $V_b$ can be varied and as shown in FIG. 3, the resultant signal $V_R$ is given by $$V_R^2 = 2V^2(1+\cos\theta) \tag{1}$$

In equation (1) it is assumed that the amplitude of the signals in the channels a and b are the same i.e. $V_a = V_b = V$.

Thus, by varying the phase angle θ with phase shifter 32 selectively, the amplitude of the resultant combination $V_R$ produced by the power combiner 23 can be varied between zero and 2V.

The phase angle θ produced by the phase shifter 32 is set by control circuit 33 under the control of the radar computers 31 through monitoring and control circuit 7. Thus, the radar computers 31 can set the desired range of operation of the radar by controlling the output power produced at port 26, by altering the phase shift produced by phase shifter 32. The phase shift can be performed rapidly, in a range of 10 to 50 microseconds, to an accuracy of ±1 dB in incremental steps of 2 dB, so as to allow the range to be selected during rotation of the antenna directive pattern.

The phase shifter 32 may in practice comprise a model QQ-1668 manufactured by KDI/Triangle Electronics Inc., East Hanover, N.J. 07936, U.S.A.

Additionally, circuits are provided to monitor and control the power level dynamically to a particular set value. To this end, a power monitor 34 is connected to the port 26, which provides signals indicative of the dynamic output power on lines 35 to the monitoring and control circuit 7. The signals are compared with reference values indicative of the required output power level determined by the radar computers 31. The signal indicative of the difference between the actual monitored power level and the required value is fed to control circuit 33 in order to produce a small adjustment of the phase shift produced by phase shifter 32 in order to return the output power level to the required value. It will be appreciated that the required value of the output power will vary dynamically during rotation of the antenna directive pattern, under the control of the radar computers 31, and the described feedback loop causes the output power to be maintained at the required value.

Additional control loops are provided in order to monitor the signals $V_a$ and $V_b$ during operation. To this end, power monitors 36, 37 and 38 are coupled respectively to the input 12 of the power splitter 11, and the outputs of driver amplifiers 17, 18. The monitors 36, 37, 38 provide respective inputs to the control circuit 33 so that the phase shifter 32 can be operated to compensate for operational variations in the amplitude and/or phase of the respective monitored signals.

Also, the operational temperature of the drive circuit 9 is monitored by a temperature monitor circuit 39 and the gain of the amplifiers 17, 18 is controlled to compensate for gain variations that otherwise might be caused by changes in temperature.

For a fuller discussion of the various circuit components of FIG. 2, reference is directed to "Radio Frequency Transistors" N. Dye & H. Granberg Butterworth-Heinemann 1993, U.S.A.

Thus, in accordance with the invention, the transmitted power at port 26 can be varied dynamically as the antenna directive pattern is rotated, so as to allow dynamic range selection. Whilst the invention has been described by way of example with reference to a Mode-S SSR, it will be appreciated that the invention can be used in other secondary surveillance radars where rapid and accurate power control is required for other operational rasons e.g. to reduce transmitted power over specified azimuth sectors in which radiation at full power would interfere with other radars or electronic equipment.

We claim:

1. A secondary surveillance radar including:
   a transmitter to transmit radar signals that interrogate transponders on remote targets;
   a receiver to receive returns from the interrogated transponders on the targets; and
   a controllable power source to produce r.f. signals for the transmitter, comprising circuitry to produce first and second r.f. signals having a predetermined phase relationship; a phase setter that sets the phase relationship between first and second signals selectively; first and second power amplifiers to amplify the first and second signals respectively; and a power combiner to combine the first and second signals amplified by the amplifiers whereby to provide an amplified r.f. output signal of a power dependent upon the phase relationship set by the phase setter.

2. A secondary surveillance radar according to claim 1 wherein the controllable power source includes first and second channels for the first and second signals, and a r.f. source to provide the first and second signals in the first and second channels respectively.

3. A secondary surveillance radar according to claim 2 wherein the r.f. source comprises an r.f. oscillator, and including a power splitter having an input coupled to the oscillator and first and second outputs connected to said channels respectively.

4. A secondary surveillance radar according to claim 2 including first and second drive amplifiers in the first and second channels respectively.

5. A secondary surveillance radar according to claim 4 including a temperature monitor, and circuitry to control the gains of the drive amplifiers as a function of the monitored temperature.

6. A secondary surveillance radar according to claim 4 including first and second preamplifiers for the drive amplifiers, in the first and second channels respectively.

7. A secondary surveillance radar according to claim 2 wherein the phase setter comprises a phase shifter in one of said channels.

8. A secondary surveillance radar according to claim 2 including a power monitor operable to monitor the power levels in the first and second channels respectively, and drive control circuitry operatable to control the phase relationship set by the phase setter in dependence upon said monitored power levels.

9. a secondary surveillance radar according to claim 3 including a power monitor operable to monitor the input power of r.f. signal fed from the r.f. source to the splitter, and a drive controller to control the phase relationship set by the phase setter in dependence upon the monitored input power.

10. A secondary surveillance radar according to claim 1 including a power monitor configured to monitor the power of the amplified r.f. output signals from the power combiner, and a controller operable to control the phase relationship set by the phase setter in dependence upon monitored power of the output signal.

11. A secondary surveillance radar according to claim 1 including a modulator to modulate the the controllable power source.

12. A secondary surveillance radar according to claim 11 wherein the modulator pulse modulates the r.f. signals for the transmitter with data to be transmitted to the targets.

13. A secondary surveillance radar according to claim 1 wherein the receiver is operable to demodulate returns from the interrogated transponders for deriving data therefrom.

14. A secondary surveillance radar according to claim 1 wherein the transmitter includes an antenna with a rotary directive pattern.

15. A secondary surveillance radar according to claim 1 wherein the transmitter and the receiver use common antenna.

16. A secondary surveillance radar according to claim 1 including range selecting circuitry operable to control the phase setter so as to control the output power of the transmitter.

17. A Mode-S SSR comprising:
   an antenna configuration;
   a transmitter coupled to the antenna configuration to transmit radar signals that interrogate transponders on remote targets;
   a receiver coupled to the antenna configuration to receive returns from the interrogated transponders on the targets; and
   a controllable power source to produce r.f. signals for the transmitter, comprising circuitry to produce first and second r.f. signals; a phase setter that sets the phase relationship between the first and second signals selectively; first and second power amplifiers to amplify the first and second signals respectively; and a power combiner to combine the first and second signals amplified by the power amplifiers whereby to provide an amplified r.f. output signal of a power dependent upon the phase relationship set by the phase setter.

18. A method of operating a secondary surveillance radar including:

transmitting radar signals so as to interrogate transponders on remote targets; receiving returns from the interrogated transponders on the targets; and controlling the power of the transmitted signals, comprising producing first and second r.f. signals; selectively setting the phase relationship between the first and second signals; amplify the first and second signal respectively; combining the first and second amplified signals whereby to provide an amplified r.f output signal for transmission.

19. A method according to claim 18 including monitoring the output power for the transmitted radar signals and maintaining the power thereof constant for a given duration by controlling said phase relationship.

20. A method according to claim 18 including modulating the transmitted radar signals with data to be received by the target.

21. A method according to claim 18, including decoding data transmitted by the target.

22. A method of operating a Mode-S SSR including:

transmitting radar signals from an antenna configuration so as to interrogate transponders on remote targets;

receiving returns from the interrogated transponders on the targets at the antenna configuration; and controlling the power of the transmitted signals, by producing first and second r.f. signals; selectively setting the phase relationship between the first and second signals amplifying the first and second signals respectively; combining the first and second amplified signals whereby to provide an amplified r.f. output signal of a power dependent upon the set phase relationship; and feeding the out signal to the antenna configuration for transmission.

* * * * *